(12) United States Patent
Yamashita

(10) Patent No.: US 11,563,413 B2
(45) Date of Patent: Jan. 24, 2023

(54) TUNING FORK-TYPE VIBRATING REED, TUNING FORK-TYPE VIBRATOR AND MANUFACTURING METHOD THEREFOR

(71) Applicant: DAISHINKU CORPORATION, Kakogawa (JP)

(72) Inventor: Hiroaki Yamashita, Kakogawa (JP)

(73) Assignee: DAISHINKU CORPORATION, Hyogo (JP)

( * ) Notice: Subject to any disclaimer, the term of this patent is extended or adjusted under 35 U.S.C. 154(b) by 790 days.

(21) Appl. No.: 16/467,272

(22) PCT Filed: Nov. 1, 2017

(86) PCT No.: PCT/JP2017/039577
§ 371 (c)(1),
(2) Date: Jun. 6, 2019

(87) PCT Pub. No.: WO2018/116651
PCT Pub. Date: Jun. 28, 2018

(65) Prior Publication Data
US 2020/0067485 A1 Feb. 27, 2020

(30) Foreign Application Priority Data
Dec. 22, 2016 (JP) .............................. JP2016-249756

(51) Int. Cl.
*H03H 3/04* (2006.01)
*H03H 9/21* (2006.01)
*H03H 3/02* (2006.01)

(52) U.S. Cl.
CPC ................ *H03H 3/04* (2013.01); *H03H 9/21* (2013.01); *H03H 2003/026* (2013.01); *H03H 2003/0414* (2013.01); *H03H 2003/0421* (2013.01); *H03H 2003/0442* (2013.01)

(58) Field of Classification Search
CPC ...... H03H 9/21; H03H 3/04; H03H 2003/026; H03H 2003/0414; H03H 2003/0421; H03H 2003/0442; H03H 9/1021; H03H 3/02
USPC .......................................................... 333/200
See application file for complete search history.

(56) References Cited

U.S. PATENT DOCUMENTS

2014/0152153 A1    6/2014   Yamada

FOREIGN PATENT DOCUMENTS

| JP | 2-220508 A | 9/1990 |
|----|------------|--------|
| JP | 2-233009 A | 9/1990 |
| JP | 2003-133879 A | 5/2003 |
| JP | 2003-332872 A | 11/2003 |
| JP | 2005-109594 A | 4/2005 |
| JP | 2009-232376 A | 10/2009 |

(Continued)

OTHER PUBLICATIONS

Machine English Translation of JP2009232376 A1 Published on Oct. 8, 2009 (Year: 2009).*

*Primary Examiner* — Samuel S Outten
*Assistant Examiner* — Jorge L Salazar, Jr.
(74) *Attorney, Agent, or Firm* — Norris McLaughlin, P.A.

(57) ABSTRACT

When a thick frequency adjustment metal film of a tuning fork-type vibration piece is irradiated with a beam on a wafer for frequency coarse adjustment, projections are possibly formed on a roughened end of the frequency adjustment metal film. Such projections are pressurized and pushed down not to chip off under any impact, so that the risk of frequency fluctuations is suppressed.

7 Claims, 7 Drawing Sheets

(56) References Cited

FOREIGN PATENT DOCUMENTS

| JP | 2013-077911 A | 4/2013 |
|---|---|---|
| JP | 2016-157892 A | 9/2016 |

\* cited by examiner

TUNING FORK-TYPE VIBRATING REED, TUNING FORK-TYPE VIBRATOR AND MANUFACTURING METHOD THEREFOR

TECHNICAL FIELD

The present invention relates to a tuning fork-type vibrator used as a clock source for electronic devices and a manufacturing method for the tuning fork-type vibrator, and a tuning fork-type vibration piece that constitutes the tuning fork-type vibrator.

BACKGROUND ART

Patent Document 1 describes a manufacturing method for a tuning fork-type vibration piece that constitutes a tuning fork-type vibrator. In this method, outer shapes of multiple tuning fork-type vibration pieces are formed on, for example, a crystal wafer by photolithography and etching. The tuning fork-type vibration pieces each have a plurality of arm portions. An electrode film and a metal film are formed on the surface of each vibration piece. The metal film is a weight member for frequency adjustment and is formed on one end side of the arm portions. The metal film is irradiated with a laser beam on the crystal wafer and thereby trimmed for coarse adjustment of frequencies of the respective vibration pieces.

CITATION LIST

Patent Documents

Patent Document 1: Japanese Patent Publication No. 2003-133879

SUMMARY OF THE INVENTION

Technical Problems

The tuning fork-type vibrator is embedded, together with an oscillator circuit, in an electronic device as a clock source. Advancing miniaturization of the electronic devices in recent years is demanding smaller tuning fork-type vibrators as small in outer dimension as, for example, 1.6 mm×1.0 mm or less in plan view. This is raising the demand for correspondingly smaller tuning fork-type vibration pieces.

The manufacture of such miniaturized tuning fork-type vibration pieces requires a high machining accuracy. The machining accuracy, however, can only be improved to a limited extent, frequencies of the multiple tuning fork-type vibration pieces formed on the wafer may be inevitably more likely to fluctuate as the vibration pieces are further miniaturized. In order to allow such variable frequencies to stay within a required frequency range, the extent of adjustment may have to be increased when the frequencies are coarsely adjusted through the laser irradiation.

Due to the fact that the frequency adjustment metal film is formed in a very limited area of the microminiaturized tuning fork-type vibration piece, the metal film may need to be increased in thickness in order to increase the extent of frequency adjustment through the laser irradiation. To be specific, it may be necessary to form the frequency adjustment metal film in a thickness of, for example, 3 μm or more using a technique such as plating.

The multiple tuning fork-type vibration pieces, after their frequencies are adjusted by irradiating such thicker frequency adjustment metal films with a laser beam, are broken off the wafer into individual pieces and are respectively housed in a package to be each supplied as a final product; tuning fork-type vibrator.

In such a miniaturized tuning fork-type vibrator that is frequency-adjusted by irradiating the thick metal film with a laser beam, frequency fluctuations may occur under any impact from outside. The frequency adjustment metal film, when partly removed under the laser irradiation, may be roughened with projections at its one end partly removed. In case these projections chip off under an external impact, the frequency adjustment metal film may unexpectedly reduce in mass, leading to the frequency fluctuations.

The present invention was accomplished to address the unsolved issue of the known art, and is directed to providing a tuning fork-type vibrator that may excel in impact resistance and accordingly suppress the risk of frequency fluctuations.

Solution to Problem

To this end, the present invention provides the following technical aspects.

A manufacturing method for a tuning fork-type vibrator is provided. In this method, a tuning fork-type vibration piece including a stem portion and a plurality of arm portions extending from the stem portion is joined to and mounted in a package having a housing portion. This method includes a first step of forming a frequency adjustment metal film in a tip-side part in a respective one of the arm portions of the tuning fork-type vibration piece, a second step of performing a frequency adjustment by removing the frequency adjustment metal film in part through irradiation of the tuning fork-type vibration piece with a beam, and a third step of applying a load to and pressurizing the frequency adjustment metal film partly removed.

The second step performs irradiates the tuning fork-type vibration piece with the beam to partly remove the frequency adjustment metal film for frequency adjustment. After the frequency adjustment metal film is partly removed through the beam irradiation, one end partly removed of the frequency adjustment metal film may be roughened with projections (hereinafter, "projections"). Any impact from outside large enough to cause the projections to chip off may lead to the undesired event; frequency fluctuations.

In the tuning fork-type vibrator manufacturing method according to the present invention, the frequency adjustment metal film is partly removed through the beam irradiation in the second step, and the frequency adjustment metal film is pressurized under the load applied in the third step. In this manner, the projections resulting from the beam irradiation may be pushed down toward the frequency adjustment metal film. This may prevent that any external impact damage and chip off the projections, suppressing the risk of frequency fluctuations.

Preferably, in the second step, the frequency adjustment metal film is partly removed from the tip-side part toward the stem portion in a respective one of the arm portions, and, in the third step, at least one end partly removed of the frequency adjustment metal film is pressurized under the load applied.

The projections may be generated at one end partly removed of the frequency adjustment metal film through irradiation of the tuning fork-type vibration piece with the beam. According to the method thus further characterized, therefore, the projections may be efficiently pushed down by pressurizing at least the partly removed one end under the applied load.

Preferably, in the first step, the frequency adjustment metal film is formed in the tip-side part on one of front and back main surfaces in a respective one of the arm portions of the tuning fork-type vibration piece, and, in the second step, the frequency adjustment metal film is partly removed by irradiating the tuning fork-type vibration piece with the beam directed from another one of the front and back main surfaces.

According to the method thus further characterized, radiation of the beam is directed downward, from one of the main surfaces of the tuning fork-type vibration piece, toward the other main surface where the frequency adjustment metal film is formed. Thus, metal fragments chipped off the frequency adjustment metal film and flying downward may be prevented from adhering again to the tuning fork-type vibration piece.

In the third step, preferably, a tool that holds the tuning fork-type vibration piece is used to apply the load to and pressurize the frequency adjustment metal film when the frequency adjustment metal film is joined to and mounted in the package.

In the method thus further characterized, the tuning fork-type vibration piece may be mounted in the package, and the projections at one end of the frequency adjustment metal film resulting from the beam irradiation may be pushed down well by using such a tool.

When the frequency adjustment metal film is pressurized under the load applied with this tool that holds the tuning fork-type vibration piece, a surface of the tool on which the vibration piece is being held may preferably be pressed against one longitudinal end of the tuning fork-type vibration piece and the frequency adjustment metal film at another longitudinal end of the tuning fork-type vibration piece.

According to the method thus further characterized, the surface of the tool is pressed against one longitudinal end of the tuning fork-type vibration piece and the thick frequency adjustment metal film at another longitudinal end of the tuning fork-type vibration piece. On the other hand, the arm portions between these longitudinal ends may be distanced from the surface of the tool. This may avoid contact between the tool and electrodes formed on the arm portions and accordingly prevent possible damage to the electrodes.

Preferably, in the third step, at least one of heat and ultrasonic wave is further applied to the frequency adjustment metal film in addition to the load applied to pressurize the frequency adjustment metal film.

According to the method thus further characterized, heat or ultrasonic wave, as well as the load, is applied to and pressurize the frequency adjustment metal film. The projections formed at one end of the frequency adjustment metal film by the beam irradiation, therefore, may be more reliably pushed down as flat as possible.

Preferably, the frequency adjustment metal film has a thickness greater than or equal to 3 μm.

The frequency adjustment metal film thus as thick as 3 μm or more may allow a large extent of frequency adjustment even for miniaturized tuning fork-type vibration pieces. In the frequency adjustment metal film thus thick, the projections formed at its one end by the beam irradiation may be greater in height and more likely to chip off under an external impact. By pushing down such large projections as flat as possible, effects of suppressing the risk of frequency fluctuations in the vibration piece may be even more notable.

A tuning fork-type vibration piece according to the present invention includes a stem portion and a plurality of arm portions extending from the stem portion. The arm portions each include, in a tip-side part, a frequency adjustment metal film that has been partly removed. A thickness between a raw surface of the tuning fork-type vibration piece and a surface of the frequency adjustment metal film formed on a respective one of the arm portions at one end partly removed of the frequency adjustment metal film is greater than a thickness between the raw surface of the tuning fork-type vibration piece and the surface of the frequency adjustment metal film in a part of the frequency adjustment metal film other than the one end. A difference between the thicknesses at the one end and in the part other than the one end is less than or equal to 0.5 times of the thickness in the part other than the one end.

After the frequency adjustment metal film is partly removed by irradiating the tuning fork-type vibration piece with the beam, the one end partly removed of the frequency adjustment metal film may be roughened with projections. The projections thus formed may easily chip off, causing the undesired event; frequency fluctuations. These projections may easily chip off because of their lengths of more than 0.5 times of the thickness between the raw surface of the tuning fork-type vibration piece and the surface of the frequency adjustment metal film on a beam-unirradiated part other than the one end.

In the tuning fork-type vibration piece according to the present invention, a difference between the following thicknesses; thickness between the raw surface of the tuning fork-type vibration piece and the surface of the frequency adjustment metal film at the one end partly removed of the frequency adjustment metal film, and thickness between the raw surface of the tuning fork-type vibration piece and the surface of the frequency adjustment metal film on a part other than the one end, i.e., a difference equivalent to the height of the projections, is less than or equal to 0.5 times of the thickness between the raw surface of the vibration piece and the surface of the frequency adjustment metal film in any beam-unirradiated part other than the one end.

This may be rephrased that, in the tuning fork-type vibration piece according to the present invention, there is no projection greater in height than 0.5 times of the thickness between the raw surface of the tuning fork-type vibration piece and the surface of the frequency adjustment metal film in a part other than the one end partly removed of the frequency adjustment metal film. This may prevent that the projections chip off under an external impact, effectively suppressing the risk of frequency fluctuations.

A tuning fork-type vibrator according to the present invention includes the tuning fork-type vibration piece according to the present invention, a package body having a housing portion for the tuning fork-type vibration piece to be housed, and a lid member that seals an opening of the package body in which the tuning fork-type vibration piece is housed, wherein the tuning fork-type vibration piece is joined to and supported by electrodes in the housing portion of the package body.

The tuning fork-type vibrator according to the present invention is mounted with the tuning fork-type vibration piece in which the projections have been pushed down and substantially flattened. In this tuning fork-type vibrator, the projections may be prevented from chipping off under an external impact, and the risk of frequency fluctuations may be accordingly suppressed.

Effects of the Invention

The present invention may avoid the formation of such projections that stick out from roughened one end of the frequency adjustment metal film partly removed, and may accordingly eliminate the risk of the undesired event; chipped-off projections under any impact. The tuning fork-type vibrator according to the present invention, therefore, may successfully suppress the risk of frequency fluctuations and may excel in impact resistance.

EMBODIMENTS OF THE INVENTION

Embodiments of the present invention are hereinafter described in detail referring to the accompanying drawings.

Figure 1:
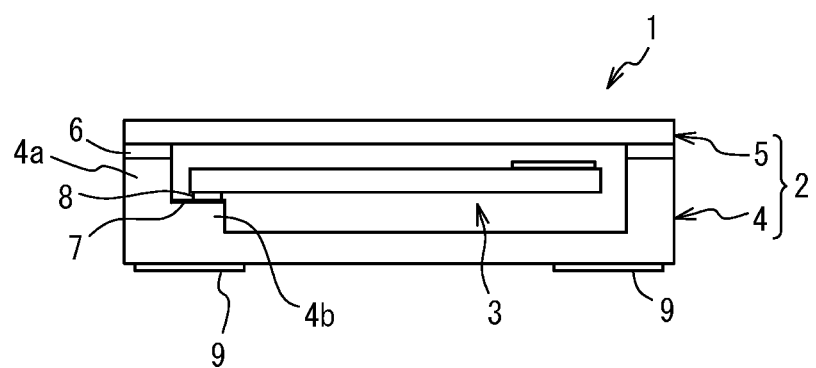
FIG. 1 is a schematic view in cross section of a crystal vibrator according to an embodiment of the present invention.
Figure 2:
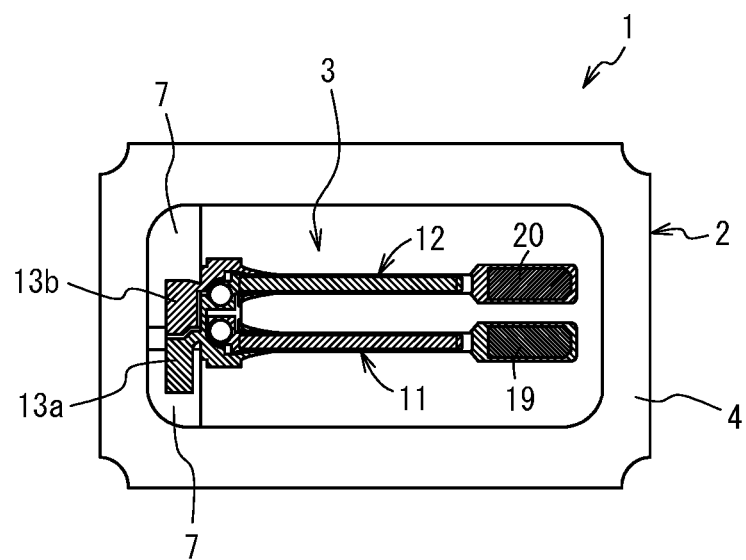
FIG. 2 is a plan view of the crystal vibrator illustrated in FIG. 1 from which a lid member has been detached.
Figure 3:
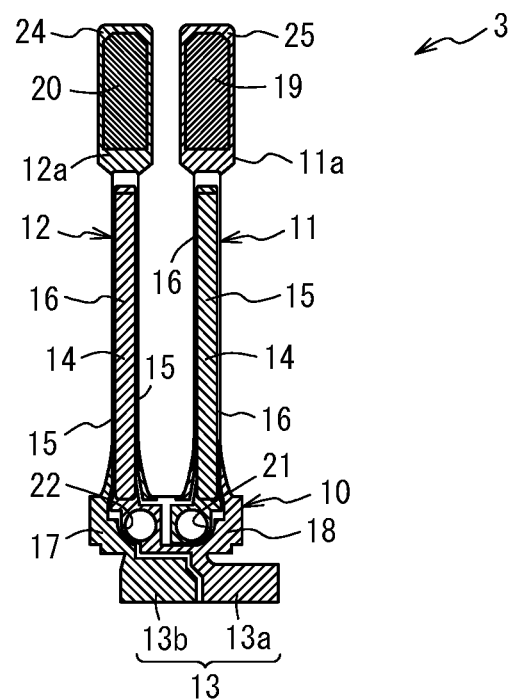
FIG. 3 is an enlarged view of a main-surface side of a crystal vibration piece illustrated in FIG. 1.
Figure 4:
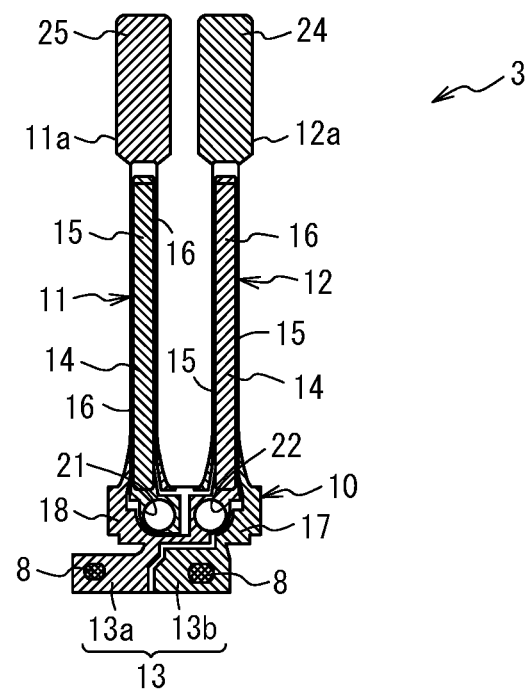
FIG. 4 is an enlarged view of another main-surface side of the crystal vibration piece illustrated in FIG. 1.

FIG. 1 is a schematic view in cross section of a tuning fork-type crystal vibrator (hereinafter referred to as "crystal vibrator") according to an embodiment of the present invention. FIG. 2 is a plan view of the crystal vibrator illustrated in FIG. 1 from which a lid member 5 has been detached. FIG. 3 is an enlarged view of a main-surface side of a tuning fork-type crystal vibration piece (hereinafter referred to as "crystal vibration piece"). FIG. 4 is an enlarged view of another main-surface side of the crystal vibration piece 3.

In a crystal vibrator 1 according to this embodiment, the crystal vibration piece 3 is housed in a package 2 made of, for example, a ceramic material. The package 2 includes a base 4 which is a body, and a lid member 5. The base 4 and the lid member 5 are joined to each other with a sealing member 6. Specifically, the crystal vibration piece 3 is joined, with a pair of metal bumps 8; joining material, to a pair of electrode pads 7 on the base 4 having an opening on its upper side, and the plate-shaped lid member is joined to the base 4 so as to close the opening. The joining material is not necessarily limited to the metal bumps 8 and may be selected from other materials including a conductive resin adhesive and a brazing filler material.

While the nominal frequency of this crystal vibrator 1 according to this embodiment is 32.768 kHz, other frequencies may be applicable instead of the nominal frequency.

The base 4 of the package 2 is a container having insulating properties which is made of, for example, a ceramic or glass material. In this embodiment, a ceramic material is used to make the base 4, and the base 4 is formed by firing. The base 4 has an opening on its upper side and has a recessed shape in cross section surrounded by a peripheral wall 4a. Inside of the base 4 (housing portion) is formed a step 4b to receive the crystal vibration piece 3. The step 4b has, on its upper surface, the electrode pads 7 that are formed in a pair. The electrode pads 7 are electrically connected to two terminal electrodes 9 on an outer bottom surface (back surface) of the base 4 through a wiring pattern, not illustrated in the drawing, formed inside of the base 4.

The lid member 5 is a solid plate rectangular in plan view and made of, for example, a metal, ceramic, or glass material.

The crystal vibrator 1 according to this embodiment is a microminiaturized vibrator in which outer dimensions of the package 2 rectangular in plan view are, for example, 1.6 mm×1.0 mm, and the height of the package 2 inclusive of the lid member 5 is, for example, 0.45 mm.

The outer dimensions of the crystal vibrator 1 provided by the present invention are not thus limited and may be greater or smaller than the before-mentioned values, for example, 2.0 mm×1.2 mm or 1.2 mm×1.0 mm.

The crystal vibration piece 3 which will be housed in the package 2 of the crystal vibrator 1 are obtained from a sheet of crystal wafer not illustrated in the drawings. The outer shapes of multiple crystal vibration pieces 3 are formed on the crystal wafer at once by photolithography, specifically, by, for example, wet etching using a resist or metal film as mask.

As illustrated in FIGS. 3 and 4, the crystal vibration piece 3 includes a stem portion 10, a pair of first and second arm portions 11 and 12 which are vibrating portions extending in parallel from one end side of the stem portion 10, and a joining portion 13 which is formed on the other end side of the stem portion 10 to join to the base 4.

The first and second arm portions 11 and 12 respectively have tip-side parts 11a and 12a that are increased in width, i.e., increased in dimension in a direction orthogonal to a direction in which the arm portions 11 and 12 are extending (lateral direction on FIGS. 3 and 4).

Further, the first and second arm portions 11 and 12 respectively have grooves 14 on their main surfaces illustrated in FIGS. 3 and 4. The grooves 14 are formed along the extending direction of the arm portions 11 and 12.

The crystal vibration piece 3 includes two first driving electrodes 15 and second driving electrodes 16, and extraction electrodes 17 and 18 that are respectively extracted from the driving electrodes 15 and 16 to electrically connect these driving electrodes to the electrode pads 7 of the base 4. The first and second driving electrodes 15 and 16 are partly located in the grooves 14 formed on the two main surfaces.

The first driving electrodes 15 are respectively formed on both main surfaces of the first arm portion 11 inclusive of the grooves 14 and on both side surfaces of the second arm portion 12. The first driving electrodes 15 are both connected to the extraction electrode 17. Similarly, the second driving electrodes 16 are respectively formed on both main surfaces of the second arm portion 12 inclusive of the grooves 14 and on both side surfaces of the first arm portion 11, and the second driving electrodes 16 are both connected to the extraction electrode 18.

Through holes 21 and 22 are formed in a pair in a region of the stem portion 10 where the driving electrodes 15 and 15 are formed. The driving electrodes 15 and 16 on the main surfaces are respectively interconnected through the through holes 21 and 22. In this description, the through hole refers to a hole penetrating through the stem portion and having an inner wall surface coated with a metal film, serving as an electrode. Instead of the through hole, the driving electrodes on the main surfaces in the crystal vibration piece may be respectively interconnected through side surfaces of the stem portion or through a region between joints of the arm and stem portions (origin of bifurcation).

In the first and second arm portions 11 and 12, tip-of-arm electrodes 25 and 24 are formed in regions increased in width of the tip-side parts 11a and 12a along their circumferences. The tip-of-arm electrodes 24 and 25 may have a thickness of, for example, approximately 0.1 μm to 0.4 μm. The tip-of-arm electrodes 25 formed along the circumference of the tip-side part 11a are connected to the second driving electrodes 16 formed on the side surfaces of the first arm portion 11. The tip-of-arm electrodes 24 formed along the circumference of the tip-side part 12a are connected to the first driving electrodes 15 formed on the side surfaces of the second arm portion 12.

Frequency adjustment metal films 19 and 20 are formed on the tip-of-arm electrodes 25 and 24 on the main surfaces on one side illustrated in FIG. 3. The frequency adjustment metal films 19, 20 are formed in a slightly smaller area than the tip-of-arm electrode 25, 24 and are irradiated with, for ample, a laser beam and thereby reduced in mass for coarse frequency adjustment of the crystal vibration piece 3.

The first and second driving electrodes 15 and 16, extraction electrodes 17 and 18, and tip-of-arm electrodes 24 and 25 of the crystal vibration piece 3 are thin films in which a metal, for example, gold, is deposited on chromium layers formed by metallization on the arm portions 11 and 12. Such a thin film is formed on the whole surface of a base material by, for example, vacuum deposition or sputtering and then subjected to metal etching using photolithography and formed into a desired shape. The metals used in the first and second driving electrodes 15 and 16, extraction electrodes 17 and 18, and tip-of-arm electrodes 24 and 25 are not necessarily limited to the combination of chromium and gold, and may instead be the combination of chromium and silver.

The metal films 19 and 20 are formed on the tip-side parts 11a and 12a of the arm portions 11 and 12 by, for example, plating such as electrolytic plating. The frequency adjustment metal films 19 and 20 may preferably be formed in the process of forming the metal bumps 8 described later. In this embodiment, gold (Au) is used to form the frequency adjustment metal films 19 and 20.

The extraction electrode 17 extracted from the first driving electrodes 15 is extended to and formed in a first joining portion 13b on one end side of the joining portion 13. The extraction electrode 18 extracted from the second driving electrodes 16 is extended to and formed in a second joining portion 13a on the other end side.

Two metal bumps 8 are formed in the joining portion 13 on the other main-surface side illustrated in FIG. 4 to be joined to the electrode pads 7 of the base 4. One of the metal bumps 8 is formed on the extraction electrode 17 in the first joining portion 13b, while the other one of the metal bumps 8 is formed on the extraction electrode 18 in the second joining portion 13a. The metal bump 8 has an oval shape in plan view, however, may be shaped otherwise. Examples of the other optional shapes may include circular shapes, and polygonal, for example, rectangular and square shapes. The metal bumps 8 are formed by plating, for example, electrolytic plating.

A manufacturing method for a crystal vibrator according to this embodiment includes a first step of forming the frequency adjustment metal films 19 and 22 by, for example, electrolytic plating on a main-surface side of the arm portions 11 and 12 in a respective one of the crystal vibration pieces 3 formed on a crystal wafer, and a second step of performing a coarse frequency adjustment by removing the frequency adjustment metal films 19 and 22 in part for mass reduction through irradiation of a laser beam.

Figure 5:
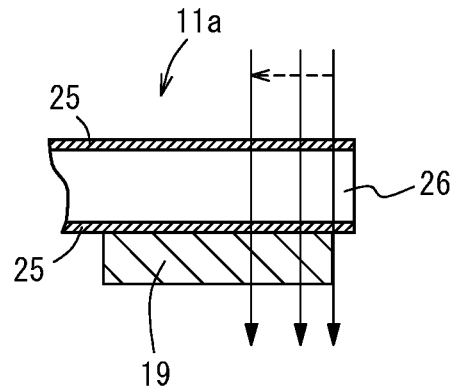
FIG. 5 is a drawing that illustrates coarse frequency adjustment through irradiation of a crystal vibration piece with a laser beam.

FIG. 5 is a drawing that illustrates the coarse frequency adjustment through the laser beam irradiation. While FIG. 5 illustrates the laser beam radiation toward the frequency adjustment metal film 19 formed on the tip-side part 11a of the first arm portion 11 alone, the coarse frequency adjustment through the laser beam irradiation is also performed for the frequency adjustment metal film 20 formed on the tip-side part 12a of the second arm portion 12.

A laser beam source (not illustrated in the drawings) is positioned so as to face one main-surface side of the crystal vibration pieces 3 on the crystal wafer. The laser beam is then radiated from the source so as to remove the frequency adjustment metal film 19 on the other main-surface side.

This laser beam irradiation starts at the tip-side part (right side in FIG. 5) where the mass reduction induces a highest level of frequency fluctuation, advancing along the width direction of the first arm portion 11 (direction perpendicular to the drawing of FIG. 5) at positions shifted by degrees toward the stem portion 10 of the first arm portion 11 (left side on FIG. 5).

The radiated laser beam enters one main-surface side of the crystal vibration pieces 3 on the crystal wafer and transmits through crystal 26 inside of the crystal vibration pieces 3, and then arrives at the frequency adjustment metal films 19 formed on the opposite main-surface side, consequently removing the tip-of-arm electrodes 25 and the frequency adjustment metal films 19 on the two main-surface sides.

By thus irradiating the frequency adjustment metal films 19 with the laser beam directed from the upper side and transmitting through the crystal 26 inside of the crystal vibration piece 3, metal fragments chipped off the frequency adjustment metal films 19 may fly downward away from these metal films. This may prevent the metal fragments from adhering again to the crystal vibration pieces 3. The laser beam may be directed so as to transmit through the crystal from the lower to upper side of the crystal vibration pieces 3. The frequency adjustment metal film may be formed on the main surfaces on both sides of the crystal vibration piece.

The laser used in this embodiment is a green laser, however, may be selected from other lasers having different wavelengths, including YAG laser.

As described earlier, frequencies of the multiple tuning fork-type vibration pieces on the crystal wafer may easily become more variable. In the microminiaturized crystal vibrator 1, therefore, the amount of coarse frequency adjustment with the frequency adjustment metal films 19 and 20 under the laser beam irradiation may have to be increased to allow the variability to stay within a required range, which makes it necessary to increase thicknesses of the frequency adjustment metal films 19 and 20. In such a microminiaturized crystal vibrator 1 as described in this embodiment in which the package 2 has outer dimensions of approximately 1.6 mm×1.0 mm, the frequency adjustment metal film 19, 20 may preferably have a thickness of greater than or equal to 3 μm and less than or equal to more and 9 μm. The frequency adjustment metal films 19 and 20 in this embodiment are formed by plating as described earlier, and are, for example 5 μm in thickness.

As the crystal vibrators are further miniaturized, the crystal vibration pieces used in such vibrators are correspondingly smaller, narrowing an area allowed for the frequency adjustment metal films to be formed. If the frequency adjustment metal film is too large in area to ensure an enough amount of adjustment, the crystal vibrator may have poor properties. Thus, securing a larger area of the frequency adjustment metal film alone does not necessarily promise a required level of adjustment, which raises the need to increase the frequency adjustment metal films in thickness.

When the package of a crystal vibrator rectangular in plan view has outer dimensions of 1.6 mm×1.0 mm as described in this embodiment, the frequency adjustment metal films should necessarily be 3 μm or more in thickness.

In case the package rectangular in plan view is further reduced in size to, for example, outer dimensions of 1.2 mm×1.0 mm, the frequency adjustment metal films may have to be 7 μm or more in thickness. In that case, the thickness of the frequency adjustment metal film may be at most 13 μm or less in view of precisions required of frequency adjustment and laser beam-used machining.

Figure 6:
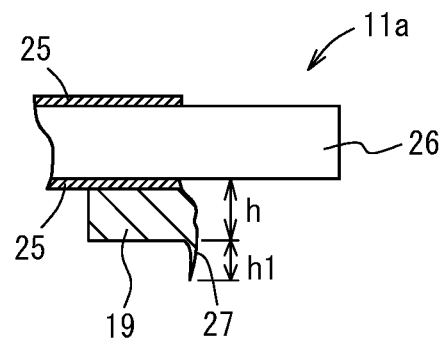
FIG. 6 is a drawing of a state subsequent to the laser beam irradiation performed as illustrated in FIG. 5.

FIG. 6 is a drawing of a state after the frequency adjustment metal film increased in thickness is irradiated with a laser beam as illustrated in FIG. 5.

Subsequent to the laser irradiation, one end thereby partly removed of the frequency adjustment metal 19 is roughened with a projection 27 directed along the laser irradiation, as illustrated in FIG. 6. FIG. 6 is a drawing of the frequency adjustment metal film 19 on the tip-side part 11a of the arm portion 11, similarly to FIG. 5. The projection 27 is also formed at one end of the frequency adjustment metal film 20 of the second arm portion 12 irradiated with the laser beam.

A height "h1" and a height "h" were measured with a laser microscope, where the "h1" is a height of the projection 27 from the surface of the frequency adjustment metal film 19 at a position beyond the range of laser irradiation on the outside of its one end partly removed, and the "h" is a height (thickness) from the raw surface of the crystal 26 to the surface of the frequency adjustment metal film 19 at a position beyond the range of laser irradiation.

According to a result of this measurement, the height "h1" of the projection 27 may be expressed by the following formula 1) using the height (thickness) "h" from the raw surface of the crystal 26 to the surface of the frequency adjustment metal film 19 at a position beyond the range of laser irradiation.

$$0.5\ h < h1 \leq 1.2\ h \qquad 1)$$

The "h" is in the range of 3 μm≤h≤9 μm when the package 2 according to this embodiment has outer dimensions of, for example, 1.6 mm×1.0 mm.

The "h" is in the range of 7 μm≤h≤13 μm when the package has smaller outer dimensions of 1.2 mm×1.0 mm than in this embodiment.

While the tip-of-arm electrode 25 in FIG. 6, and FIG. 9 described later is discernibly illustrated in a substantial thickness, the thickness of the tip-of-arm electrode 25 in life size is adequately small, as compared with the "h". Therefore, a total thickness, inclusive of the thickness of the tip-of-arm electrode 25, may be regarded as the thickness of the frequency adjustment metal film 19.

The projection 27 may easily chip off under an external impact, causing the frequency fluctuations.

This embodiment, therefore, attempts to eliminate the projection 27 formed by the laser beam irradiation at one end of the frequency adjustment metal film 19, 20.

The multiple crystal vibration pieces 3 on the crystal wafer, subsequent to coarse frequency adjustment under the laser beam irradiation, are broken off the crystal wafer into individual pieces, which are each joined to the electrode pads 7 and mounted in the package 2. The crystal vibrator manufacturing method according to this embodiment further includes a third step of applying a load to and pressurizing portions the frequency adjustment metal films 19 and 20 with a suctioning tool used to suction the crystal vibration piece 3 when mounted on the base 4. In this third step, the projection 27 on the roughened one end of the frequency adjustment metal films 19 and 20 are pushed down under the applied load.

How to push down the projection 27 during the mounting process is hereinafter described in detail.

The multiple crystal vibration pieces 3 have been roughly adjusted in frequency by the laser beam irradiation in the state of a crystal wafer. After that, the crystal vibration pieces 3 are each taken out from the crystal wafer as individual pieces thereof with a break-off tool and are delivered to a suction tool for mounting.

Figure 7:
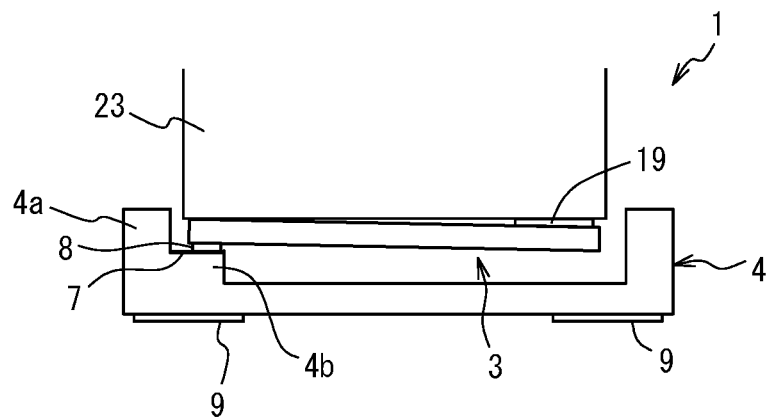
FIG. 7 is a drawing of the crystal vibration piece being mounted on a base with a suctioning tool.
Figure 8:
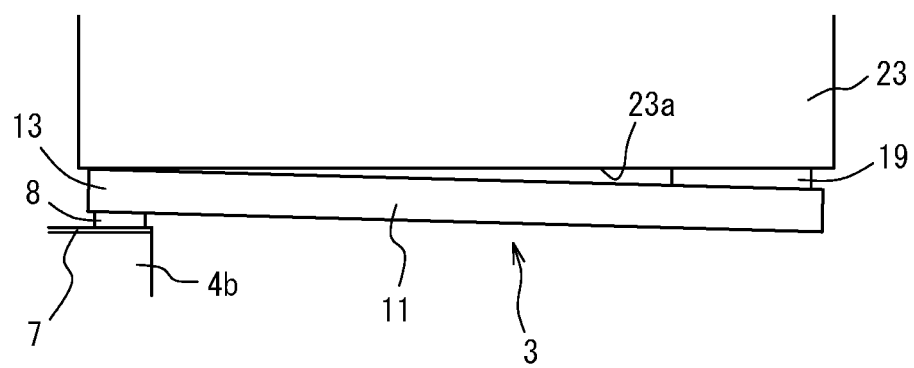
FIG. 8 is an enlarged view in part of the illustration of FIG. 7.

FIG. 7 is a drawing of the crystal vibration piece 3 being mounted on the base 4 with a suctioning tool 23 used for this purpose. FIG. 8 is an enlarged view of the crystal vibration piece 3 and the suctioning tool 23 in contact with each other. While FIGS. 7 and 8 illustrate the frequency adjustment metal film 19 of the first arm portion 11 alone, the same goes for the frequency adjustment metal film 20 of the second arm portion 12.

To mount the crystal vibration piece 3 on the base 4, the metal bumps 8 of the extraction electrodes 17 and 18 on the main surfaces on one side are ultrasonically joined by FCB (Flip Chip bonding) to the electrode pads 7 of the base 4. In the crystal vibration piece 3 illustrated in these drawings, one main-surface side where no metal bump 8 is formed, i.e., one main-surface side where the frequency adjustment metal film 19 is formed is directed upward, which is opposite to the illustrations of FIGS. 5 and 6.

The suctioning tool 23 according to this embodiment is so sized that covers a range of the crystal vibration piece 3, from the joining portion 13 on one end side in the longitudinal direction (lateral direction in FIGS. 7 and 8) where the metal bumps 18 are formed, to the tip-side parts on the other end side where the frequency adjustment metal films 19 and 20 are formed.

The suctioning tool 23 used for mounting may be selected from tools suitable for the size of the package 2, i.e., the size of the crystal vibration piece 3 and is large enough to cover the crystal vibration piece 3 from its one end side to the other end side.

At the time of mounting the crystal vibration piece 3 on the base 4, the crystal vibration piece 3 is suctioned and held by the suctioning tool 23 and thereby located at a predefined mounting position on the base 4 and then mounted on the base 4. Next, the crystal vibration piece 3 is subjected to a load and pressurized, and the electrode pads 7 of the base 4 are then joined to the metal bumps 8 of the crystal vibration piece 3 under ultrasonic radiation while being heated at the same time.

The suctioning tool 23 subject to heat and ultrasonic radiation then applies a load to and pressurizes tip-side parts of the crystal vibration piece 3 where the frequency adjustment metal films 19 and 20 are formed. After the crystal vibration piece 3 is mounted on the base 4, the projection 27 on the roughened end of the frequency adjustment metal film 19 irradiated with the laser beam is pushed down into a projection 27a reduced in height, as illustrated in FIG. 9.

When a load is applied to the crystal vibration piece 3 with the suctioning tool 23, as illustrated in the enlarged view of FIG. 8, a surface 23a of the suctioning tool 23 on which the crystal vibration piece 3 is being held is pressed against the joining portion 13 on one end side of the crystal vibration piece 3 where the metal bumps 8 are formed and the frequency adjustment metal film 19 on the other end side. On the other hand, an intermediate portion between one and the other end sides, i.e., a portion including the arm portions 11 and 12 and electrodes at edges of the grooves 14 are slightly distanced from the reed-holding surface 23a of the suctioning tool 23.

This may prevent that the arm portions 11 and 12 and electrodes at edges of the grooves 14 accidentally contact the reed-holding surface 23a of the suctioning tool 23 and are thereby damaged, avoiding possible adverse effects on properties of the vibration piece 3.

In this embodiment, a soft metal that excels in malleability, gold (Au), is used in the frequency adjustment metal film 19, 20. The projection 27 formed on the frequency adjustment metal film 19, 20 made of this material may be more easily pushed down toward the metal film. This may allow the crystal vibration piece 3 to improve in stability.

Figure 9:
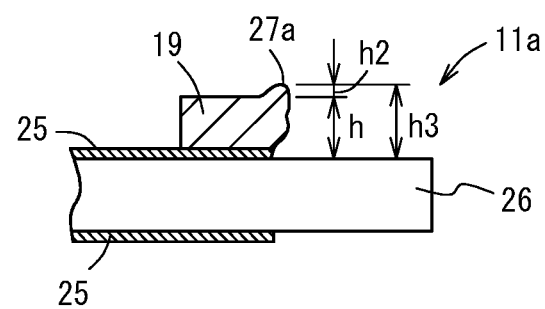
FIG. 9 is a drawing of a frequency adjustment metal film and its vicinity in the crystal vibration piece mounted on the base with the suctioning tool.

As illustrated in FIG. 9, a height "h2" and a height "h" were measured with a laser microscope, where the "h2" is a height of the projection 27a, which has been pushed down and reduced in height, from the surface of the frequency adjustment metal film 19 at a position beyond the range of laser irradiation on the outside of its one end partly removed, and the "h" is a height (thickness) from the raw surface of the crystal 26 to the surface of the frequency adjustment metal film 19 at a position beyond the range of laser irradiation.

These heights were measured similarly to the heights "h1" and "h" in the formula 1).

According to the obtained measurement result, the height "h2" of the pushed-down production 27a reduced in height is expressed by the following formula 2) using the height (thickness) "h" from the raw surface of the crystal 26 to the surface of the frequency adjustment metal film 19 at a position beyond the range of laser irradiation.

$$h2 \leq 0.5\ h \quad\quad 2)$$

This may be rephrased that a thickness "h3" from the raw surface of the crystal 26 to the surface of the frequency adjustment metal film 19 at one end partly removed of the frequency adjustment metal film 19 is greater than the thickness "h" from the raw surface of the crystal 26 to the surface of the frequency adjustment metal film at a position on the outside of the one end partly removed of the frequency adjustment metal film 19, and a difference in height "h2" between the thickness "h3" at the one end and the thickness "h" at a position on the outside of the one end is less than or equal to 0.5 times of the thickness "h".

Similarly to the formula 1), the "h" in the formula 2) is in the range of 3 μm≤h≤9 μm when the package 2 has outer dimensions of 1.6 mm×1.0 mm, and is in the range of 7 μm≤h≤13 μm when the package 2 has outer dimensions of 1.2 mm×1.0 mm.

The formula 2) is not necessarily limited to the outer dimensions of 1.6 mm×1.0 mm or 1.2 mm×1.0 mm but is also applicable to the outer dimensions of 2.0 mm×1.2 mm.

The thickness of the frequency adjustment metal film when the package has outer dimensions of 2.0 mm×1.2 mm may preferably be between 2 μm and 5 μm.

At the time of mounting the crystal vibration piece 3 on the base 4, the projection 27 at one end partly removed under the laser beam irradiation of the frequency adjustment metal film 19, 20 is pushed down by applying a load using the suctioning tool 23. Provided that the "h" is a height (thickness) from the raw surface of the crystal 26 to the surface of the frequency adjustment metal film 19, 20 at a position beyond the range of laser irradiation, the projection 27 exceeding 0.5 h no longer exists, leaving the projection 27a alone that has been pushed down and reduced in height. The projection 27 thus reduced in height may be unlikely to chip off under an external impact, which may suppress the risk of frequency fluctuations.

The crystal vibration piece 3 thus mounted on the base 4 with one side being left open is irradiated with, for example, an ion beam for final refinement. Then, the lid member 5 is, for example, melted under heat and joined, with the sealing member 6, to the base 4 mounted with the crystal vibration piece 3, and the crystal vibration piece 3 is hermetically sealed inside the package including the base 4 and the lid member 5 to obtain the crystal vibrator 1. Examples of the hermetic sealing may include seal welding, beam welding, and atmospheric heating.

Next, a test result is hereinafter described that evaluated effects on impact resistance exercised by the projection 27 formed at one end of the frequency adjustment metal film 19, 20 as a result of the time of the coarse frequency adjustment performed on the crystal wafer.

Figure 10:
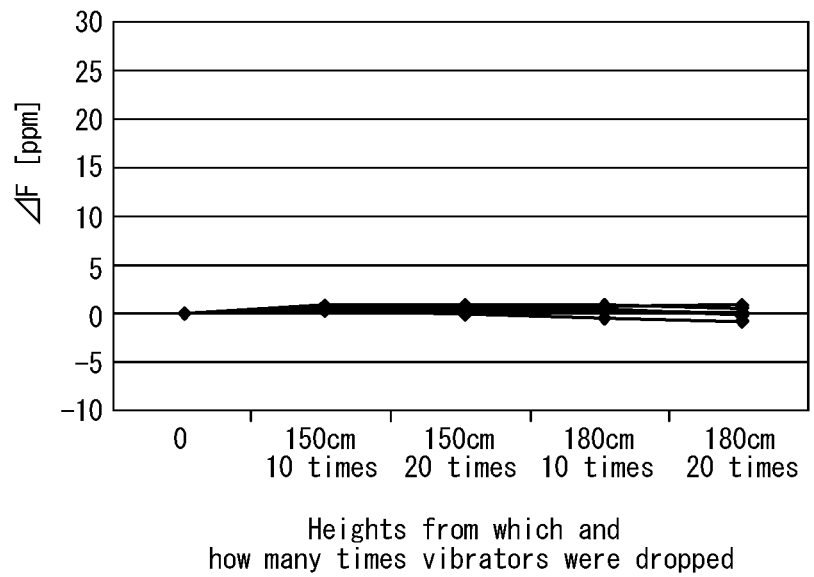
FIG. 10 is a graph showing a drop test result of the tuning fork-type vibrator according to the embodiment.

FIG. 10 is a drawing of a drop test result of the crystal vibrator 1 manufactured by the method according to this embodiment.

Figure 11:
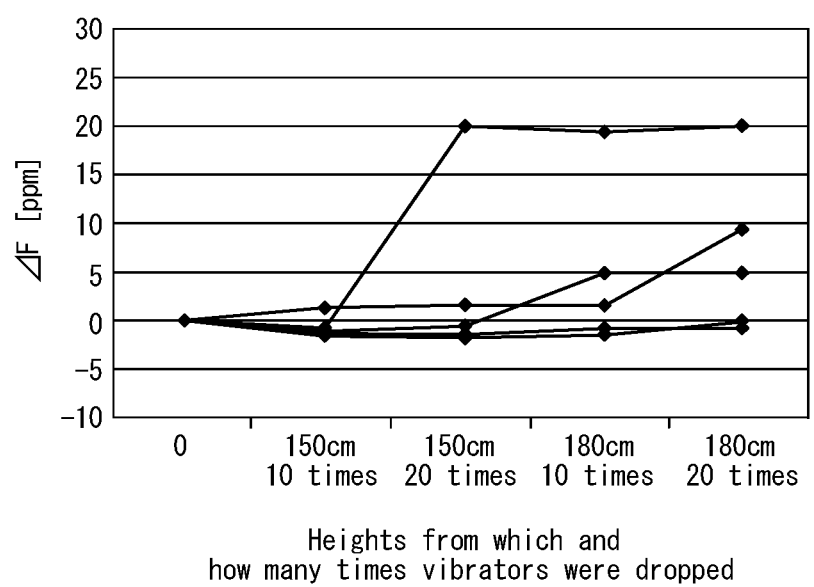
FIG. 11 is a graph showing a drop test result of a tuning fork-type vibrator according to a comparative example.

FIG. 11 is a drawing of a drop test result of a crystal vibrator according to a comparative example in which the projection 27 formed as a result of the coarse frequency adjustment at the roughened one end of the frequency adjustment metal film 19, 20 is left uncrushed.

In the crystal vibrator according to this comparative example, a different suctioning tool was used, which was smaller in length than the suctioning tool used for mounting in this embodiment in the extending direction of the first, second arm portion 11, 12 (lateral direction in FIGS. 7 and 8) of the crystal vibration piece 3 and thus not large enough to apply a load to where the frequency adjustment metal film 19, 20 was formed.

In the crystal vibrator according to the comparative example, therefore, the projection 27 formed at the roughened one end of the frequency adjustment metal film 19, 20 is left uncrushed and sticking out.

FIGS. 10 and 11 show a measurement result, in which frequency fluctuations were measured in five samples of the crystal vibrator 1 according to this embodiment and five samples of the crystal vibrator according to the comparative example when they were dropped 10 times from the height of 150 cm and when subsequently dropped again 10 times from the height of 150 cm, and when they were dropped 10 times from the height of 180 cm and when subsequently dropped again 10 times from the height of 180 cm. In these drawings, their lateral axes represent heights from which and how many times the crystal vibrators were dropped, and their longitudinal axes represent frequency deviation values, ΔF (ppm).

Frequency fluctuations were observed in none of the five samples of the crystal vibrator 1 according to this embodiment in which the projection 27 on the frequency adjustment metal film 19, 20 resulting from the coarse frequency adjustment using the laser beam irradiation was pushed down with the suctioning tool 23 when mounted on the base. On the other hand, a large extent of frequency fluctuations— especially, notable increases to higher frequencies—was observed in the five samples of the crystal vibrator according to the comparative example in which, when mounted on the base, the suctioning tool failed to push down the projection 27 on the frequency adjustment metal film 19, 20 resulting from the coarse frequency adjustment using the laser beam irradiation.

The samples of the crystal vibrator according to the comparative example marked notable increases to higher frequencies. These samples were checked after their lid members 5 were detached from the bases 4, in which chipped-off fragments of the projections 27 formed on the frequency adjustment metal films 19, 20 were found.

According to this embodiment, the projection 27 formed as a result of the frequency adjustment metal film 19, 20 being removed in part by irradiating the crystal vibration piece 3 with a beam is pushed down under a load applied with the suctioning tool 23 when the vibration piece 3 is mounted on the base 4. This may prevent the unfavorable event that the projection 27 chips off under an external impact, suppressing the risk of frequency fluctuations.

Another Embodiment

1) In the earlier embodiment, the projection 27 of the frequency adjustment metal film 19, 20 is pushed down by applying a load in the process of mounting the crystal vibration piece 3 on the base 4. This action, however, is not necessarily included in this process but may be performed at other times.

For example, the projection 27 of the frequency adjustment metal film 19, 20 may be pushed down when each piece of the crystal vibration pieces 3 broken off the crystal wafer with a break-off tool is received by the suctioning tool 23, specifically, the projection 27 may be pushed down while the frequency adjustment metal film 19, 20 is being held between the break-off tool and the suctioning tool 23.

Figure 12:
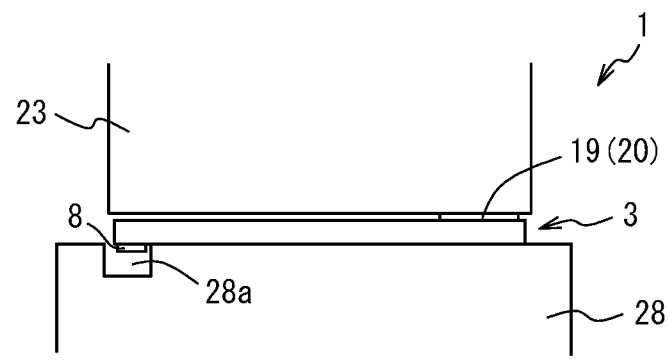
FIG. 12 is a drawing that illustrates a state of the tuning fork-type vibrator being held and pressurized between a break-off tool and the suctioning tool used for mounting.

Specifically, a portion of the crystal vibration piece 3 where the frequency adjustment metal films 19 and 20 are formed is held between a break-off tool 28 and the suctioning tool 23, as illustrated in FIG. 12. Thus, the crystal vibration piece 3, when received by the suctioning tool 23, is held between the break-off tool 28 and the suctioning tool 23 and subjected to a load to be pressurized, so that the projection 27 of the frequency adjustment metal film 19, 20 is pushed down. In this instance, a recess 28a is formed beforehand in the break-off tool 28 at a position corresponding to the metal bumps 8 so as to avoid any contact between a reed-holding surface of this tool from and the metal bumps 8.

The crystal vibration pieces 3 may be each broken off the crystal wafer with the break-off tool, with the projection 27 of the frequency adjustment metal film 19, 20 being pushed down with this tool. Thus, the projection 27 of the frequency adjustment metal film 19, 20 may be efficiently pushed down with the break-off tool when the crystal vibration pieces 3 are broken off into individual pieces.

Instead, the frequency adjustment metal films 19 and 20 in all of the multiple crystal vibration pieces 3 before they are broken off the crystal wafer may be pressurized at once with an appropriate tool to push down any projections 27 formed in the vibration pieces 3.

In case the projection 27 of the frequency adjustment metal film 19, 20 fails to be adequately pushed down under a load in one attempt, the projection 27 may be pushed down in two stages; when each piece of the crystal vibration pieces 3 is broken off the crystal wafer with the break-off tool, and when the crystal vibration piece 3 held with the break-off tool is received by the suctioning tool 23.

2) In the earlier embodiment, the joining portion 13 constituting part of the stem portion 10 extends in a direction opposite to the extending direction of the first, second arm portion 11, 12 and then in a direction orthogonal to the extending direction (rightward in FIG. 3). The joining portion 13 may have a laterally symmetrical shape, lateral ends of which extend in two directions included in the orthogonal direction (leftward and rightward in FIG. 13), as is known from the outer shape of the crystal vibration piece 3 illustrated in FIG. 13.

Figure 14:
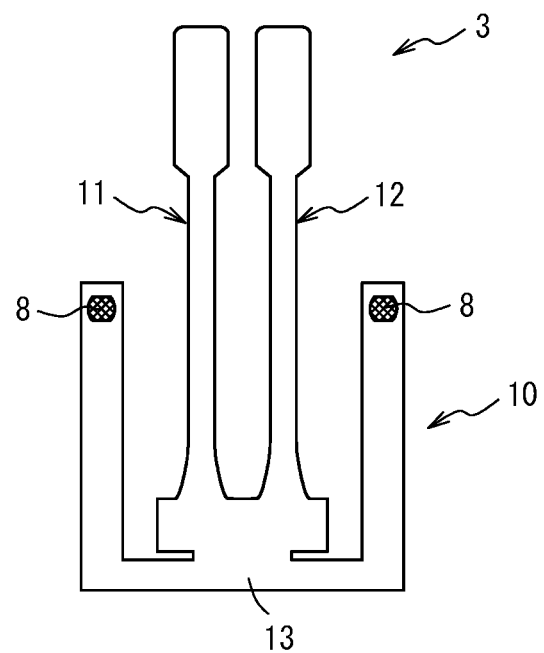
FIG. 14 is a drawing that illustrates the outer shape of a tuning fork-type vibration piece according to yet another embodiment of the present invention.

As illustrated in FIG. 14, the joining portion 13 may have a laterally symmetrical shape, lateral ends of which extend in two directions included in the orthogonal direction (leftward and rightward in FIG. 14) and further extend parallel to the extending direction of the first, second arm portion 11, 12.

Figure 13:
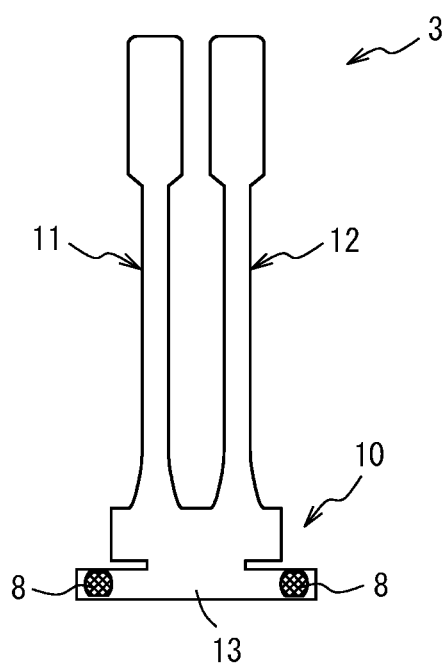
FIG. 13 is a drawing that illustrates the outer shape of a tuning fork-type vibration piece according to another embodiment of the present invention.
Figure 15:
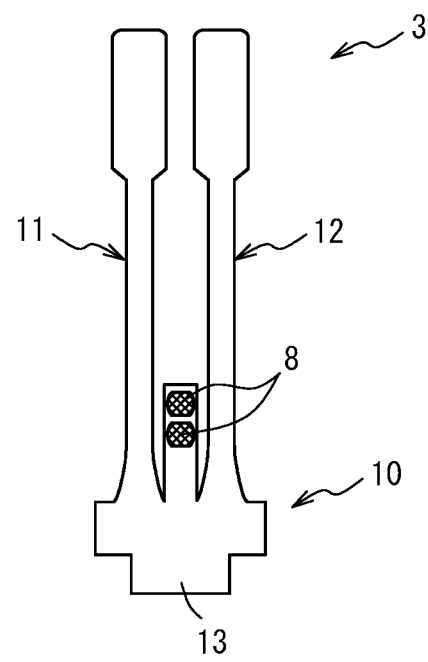
FIG. 15 is a drawing that illustrates the outer shape of a tuning fork-type vibration piece according to yet another embodiment of the present invention.

As illustrated in FIG. 15, the joining portion 13 may extend from between the first and second arm portions 11 and 12 in the extending direction of these arm portions. In the crystal vibration piece 3 in which the joining portion 13 is shaped as described so far, two metal bumps 8 to be joined to the electrode pads 7 of the base 4 are located at an end(s) of the extending joining portion 13, as illustrated in FIGS. 13 to 15. The joining portion 13 may or may not have a portion(s) formed along the extending direction or a direction(s) orthogonal to the extending direction.

3) In the earlier embodiment, the metal bumps 8 are used to join the crystal vibration piece 3 to the base 4, however, may be replaced with any other suitable means but the bumps, for example, a conductive adhesive. When such a means is used, ultrasonic radiation for the crystal vibration piece 3 to be joined to the base 4 may be unnecessary, in which case a suctioning tool simply designed to suction and hold the crystal vibration piece 3 may be used to mount the vibration piece 3 on the base 4.

4) The earlier embodiment uses the laser beam for frequency adjustments, however, may use one selected from any suitable beams but the laser beam, for example, ion beam.

5) In the earlier embodiment and modified examples described so far, the present invention is applied to the crystal vibration piece. The present invention, however, may also be applicable to any other suitable piezoelectric materials but crystal.

REFERENCE SIGNS LIST

1 tuning fork-type crystal vibrator
2 package
3 tuning fork-type crystal vibration piece
4 base
5 lid member
7 electrode pad
8 metal bump 10 stem portion
11 first arm portion
12 second arm portion
13 joining portion
15 first driving electrode
16 second driving electrode
17, 18 extraction electrode
19, 20 frequency adjustment metal film
23 suctioning tool
24, 25 tip-of-arm electrode
26 crystal
27 projection (roughened end)
27a projection (pressed down and reduced in height)

The invention claimed is:

1. A manufacturing method for a tuning fork-type vibrator, the method comprising joining a tuning fork-type vibration piece to a package having a housing portion, and mounting the tuning fork-type vibration piece in the package,
the tuning fork-type vibration piece comprising:
a stem portion; and
a plurality of arm portions extending from the stem portion,
the method further comprising:
a first step of forming a frequency adjustment metal film in a tip-side part in a respective one of the arm portions of the tuning fork-type vibration piece;
a second step of performing a frequency adjustment by removing the frequency adjustment metal film in part through irradiation of the tuning fork-type vibration piece with a beam; and
a third step of applying a load to and pressurizing an area where the frequency adjustment metal film has been partly removed.

2. The manufacturing method according to claim 1, wherein
in the second step, the area where the frequency adjustment metal film is partly removed extends from the tip-side part toward the stem portion in a respective one of the arm portions,
in the third step, at least one end of the area where the frequency adjustment metal film has been partly removed is pressurized under the load applied.

3. The manufacturing method according to claim 1 or 2, wherein
in the first step, the frequency adjustment metal film is formed in the tip-side part on one of front and back main surfaces in a respective one of the arm portions of the tuning fork-type vibration piece, and
in the second step, the frequency adjustment metal film is partly removed by irradiating the tuning fork-type vibration piece with the beam directed from another one of the front and back main surfaces.

4. The manufacturing method according to claim 1 or 2, wherein
in the third step, a tool that holds the tuning fork-type vibration piece is used to apply the load to and pressurize the area where the frequency adjustment metal film has been partly removed when the frequency adjustment metal film is joined to and mounted in the package.

5. The manufacturing method according to claim 4, wherein
a surface of the tool on which the tuning fork-type vibration piece is being held is pressed against one longitudinal end of the tuning fork-type vibration piece and the frequency adjustment metal film at another longitudinal end of the tuning fork-type vibration piece.

6. The manufacturing method according to claim 1 or 2, wherein
in the third step, at least one of heat and ultrasonic wave is further applied to the area where the frequency adjustment metal film has been partly removed in addition to the load applied to pressurize the area where the frequency adjustment metal film has been partly removed.

7. The manufacturing method according to claim 1 or 2, wherein
the frequency adjustment metal film has a thickness greater than or equal to 3 µm.

* * * * *